(12) United States Patent
Hasegawa et al.

(10) Patent No.: US 8,952,702 B2
(45) Date of Patent: Feb. 10, 2015

(54) FUEL CELL SYSTEM

(75) Inventors: Takahiko Hasegawa, Toyota (JP); Nobuyuki Kitamura, Minamitsuru-gun (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 191 days.

(21) Appl. No.: 13/638,785

(22) PCT Filed: Mar. 22, 2011

(86) PCT No.: PCT/IB2011/000608
§ 371 (c)(1),
(2), (4) Date: Oct. 1, 2012

(87) PCT Pub. No.: WO2011/121410
PCT Pub. Date: Oct. 6, 2011

(65) Prior Publication Data
US 2013/0057292 A1    Mar. 7, 2013

(30) Foreign Application Priority Data
Apr. 2, 2010   (JP) .................................. 2010-085697

(51) Int. Cl.
*G01N 27/416* (2006.01)
*H01M 8/04* (2006.01)
(Continued)

(52) U.S. Cl.
CPC ...... *H01M 8/04559* (2013.01); *H01M 8/04589* (2013.01); *H01M 8/04649* (2013.01);
(Continued)

(58) Field of Classification Search
USPC .......... 324/426–434; 429/428, 430, 431, 432, 429/13, 23; 702/65
See application file for complete search history.

(56) References Cited

U.S. PATENT DOCUMENTS 5,280,429 A     1/1994  Withers
7,702,702 B2 *  4/2010  Tanaka et al. ..................... 708/4
(Continued)

FOREIGN PATENT DOCUMENTS

CH        682 611 A5    10/1993
CN       101485026 A     7/2009
(Continued)

OTHER PUBLICATIONS

International Search Report & Written Opinion of PCT/IB2011/000608 mailed Nov. 3, 2011.
(Continued)

*Primary Examiner* — Huy Q Phan
*Assistant Examiner* — Thang Le
(74) *Attorney, Agent, or Firm* — Kenyon & Kenyon LLP (57) ABSTRACT

A fuel cell system includes a fuel cell, a multiphase voltage conversion device with N-phases (N being an integer equal to or larger than two) that is connected to the fuel cell, a control signal generation portion that generates control signals to control each phase of the multiphase voltage conversion device by superimposing a control waveform for measuring impedance on a voltage indicating an output target voltage of the multiphase voltage conversion device and sequentially outputs the control signals corresponding to N phases with a predetermined phase difference to the multiphase voltage conversion device, and an impedance calculation portion that measures a current and a voltage of the fuel cell on cycles corresponding to N predetermined sampling frequencies having a phase difference equal to the predetermined phase difference and calculates an impedance of the fuel cell based on the measured current and the measured voltage.

5 Claims, 5 Drawing Sheets

(51) Int. Cl.
*G01R 31/36* (2006.01)
*H01M 8/10* (2006.01)

(52) U.S. Cl.
CPC ....... *H01M8/04828* (2013.01); *G01R 31/3662* (2013.01); *H01M 2008/1095* (2013.01); *H01M 2250/20* (2013.01); *Y02E 60/50* (2013.01); *Y02T 90/32* (2013.01)
USPC ........... 324/434; 324/430; 324/426; 324/432; 324/431; 429/428; 429/430; 429/431; 429/23

(56) References Cited

U.S. PATENT DOCUMENTS

| | | | | |
|---|---|---|---|---|
| 2005/0287402 | A1* | 12/2005 | Maly et al. | 429/13 |
| 2006/0078788 | A1* | 4/2006 | Ramschak | 429/90 |
| 2007/0259256 | A1* | 11/2007 | Le Canut et al. | 429/90 |
| 2007/0262648 | A1* | 11/2007 | McKenzie | 307/64 |
| 2009/0033258 | A1* | 2/2009 | Atarashi | 318/400.3 |
| 2009/0117427 | A1 | 5/2009 | Manabe et al. | |
| 2010/0013490 | A1 | 1/2010 | Manabe et al. | |
| 2010/0216043 | A1* | 8/2010 | Gottmann et al. | 429/432 |
| 2010/0273072 | A1* | 10/2010 | Hasegawa et al. | 429/431 |
| 2010/0310953 | A1* | 12/2010 | Yumiya et al. | 429/429 |
| 2011/0057701 | A1* | 3/2011 | Onishi et al. | 327/231 |

FOREIGN PATENT DOCUMENTS

| | | |
|---|---|---|
| CN | 100570940 C | 12/2009 |
| DE | 11 2007 002072 T5 | 10/2009 |
| JP | 10-146049 A | 5/1998 |
| JP | 2004-015992 A | 1/2004 |
| JP | 2007-012418 A | 1/2007 |

OTHER PUBLICATIONS

International Preliminary Report on Patentability of PCT/IB2011/000608 dated Mar. 19, 2012.

* cited by examiner

FUEL CELL SYSTEM

This is a 371 national phase application of PCT/IB2011/000608 filed 22 Mar. 2011, claiming priority to Japanese Patent Application No. 2010-085697 filed 2 Apr. 2010, the contents of which are incorporated herein by reference.

FIELD OF THE INVENTION

The invention relates to a fuel cell system that measures an impedance of a fuel cell using an alternating-current impedance method.

BACKGROUND OF THE INVENTION

It is known that the internal resistance of a fuel cell influences the humidity coefficient of an electrolyte membrane inside the fuel cell. In the case where the amount of the moisture contained in the fuel cell is small and the electrolyte membrane is dry, the internal resistance is high and the output voltage of the fuel cell is low. In the case where the amount of the moisture contained in the fuel cell is excessively large, since an electrode of the fuel cell is covered with the moisture, the diffusion of oxygen and hydrogen as reactants is hampered, and the output voltage is low.

In order to operate the fuel cell with high efficiency, it is necessary to optimally manage the amount of the moisture contained in the fuel cell. It is known that the amount of the moisture contained in the fuel cell is correlated with the impedance of the fuel cell. In Japanese Patent Application Publication No. 2004-15992 (JP-A-2004-15992), an impedance of a fuel cell is measured according to an alternating-current impedance method to indirectly grasp a state of moisture contained in the fuel cell. More specifically, JP-A-2004-15992 describes superimposing a sinusoidal signal having an arbitrary frequency on an output signal of the fuel cell and measuring the impedance of the fuel cell in that case.

However, the number of times of sampling performed in measuring a voltage and a current for the measurement of the impedance is limited due to factors such as a CPU load and the like. Therefore, there is a circumstance in which no sufficient ingenuity is found as to the impedance measurement performance of the fuel cell.

SUMMARY OF THE INVENTION

The invention improves the impedance measurement performance of a fuel cell in a fuel cell system that is equipped with a multiphase voltage conversion device.

A first aspect of the invention relates to a fuel cell system. This fuel cell system is equipped with a fuel cell, a multiphase voltage conversion device with N-phases (N being an integer equal to or larger than two) that is connected to the fuel cell, a control signal generation portion that generates control signals to control each phase of the multiphase voltage conversion device by superimposing a control waveform for measuring impedance on a voltage indicating an output target voltage of the multiphase voltage conversion device and sequentially outputs the control signals corresponding to N phases with a predetermined phase difference to the multiphase voltage conversion device, and an impedance calculation portion that measures a current of the fuel cell and a voltage of the fuel cell on cycles corresponding to N predetermined sampling frequencies having a phase difference equal to the predetermined phase difference and calculates an impedance of the fuel cell based on the measured current and the measured voltage. In this configuration, when measuring the current and the voltage for calculating the impedance, the impedance calculation portion samples the current of the fuel cell and the voltage of the fuel cell on the cycles corresponding to the N predetermined sampling frequencies having the phase difference equal to the phase difference of the control signals output to control the respective phases of the multiphase voltage conversion device. As a result, a detailed sampling result close in shape to the control waveform can be obtained. Therefore, the performance of measuring the impedance of the fuel cell in the fuel cell system equipped with the multiphase voltage conversion device can be improved.

The predetermined phase difference may be 360°/N.

The aforementioned fuel cell system may further be equipped with an accumulator, and a voltage conversion device that is connected to the accumulator. In this configuration, an effect similar to that of the first aspect of the invention can be obtained even in the case of a configuration equipped with a voltage conversion device for controlling an output from an accumulator.

A second aspect of the invention relates to a method of measuring an impedance of a fuel cell system. The fuel cell system includes a fuel cell, and a multiphase voltage conversion device with N-phases (N being an integer equal to or larger than two) that is connected to the fuel cell. This method of measuring the impedance of the fuel cell system includes generating control signals to control each phase of the multiphase voltage conversion device by superimposing a control waveform for measuring impedance on a voltage indicating an output target voltage of the multiphase voltage conversion device, sequentially outputting the control signals corresponding to N phases with a predetermined phase difference to the multiphase voltage conversion device, and measuring a current of the fuel cell and a voltage of the fuel cell on cycles corresponding to N predetermined sampling frequencies having a phase difference equal to the predetermined phase difference and calculating an impedance of the fuel cell based on the measured current and the measured voltage.

It should be noted that the invention can be implemented in various forms. For example, the invention can be implemented in the modes of a fuel cell system, a method of controlling a fuel cell system, a mobile object such as a vehicle equipped with a fuel cell system or the like. Further, the invention is not absolutely required to have all the aforementioned various features, and can also be configured with some of them omitted.

BRIEF DESCRIPTION OF THE DRAWINGS

The foregoing and further features and advantages of the invention will become apparent from the following description of example embodiments of the invention with reference to the accompanying drawings, wherein like numerals are used to represent like elements and wherein.

DETAILED DESCRIPTION OF THE EMBODIMENTS

Next, the embodiments of the invention will be described.

A. First Embodiment

Figure 1:
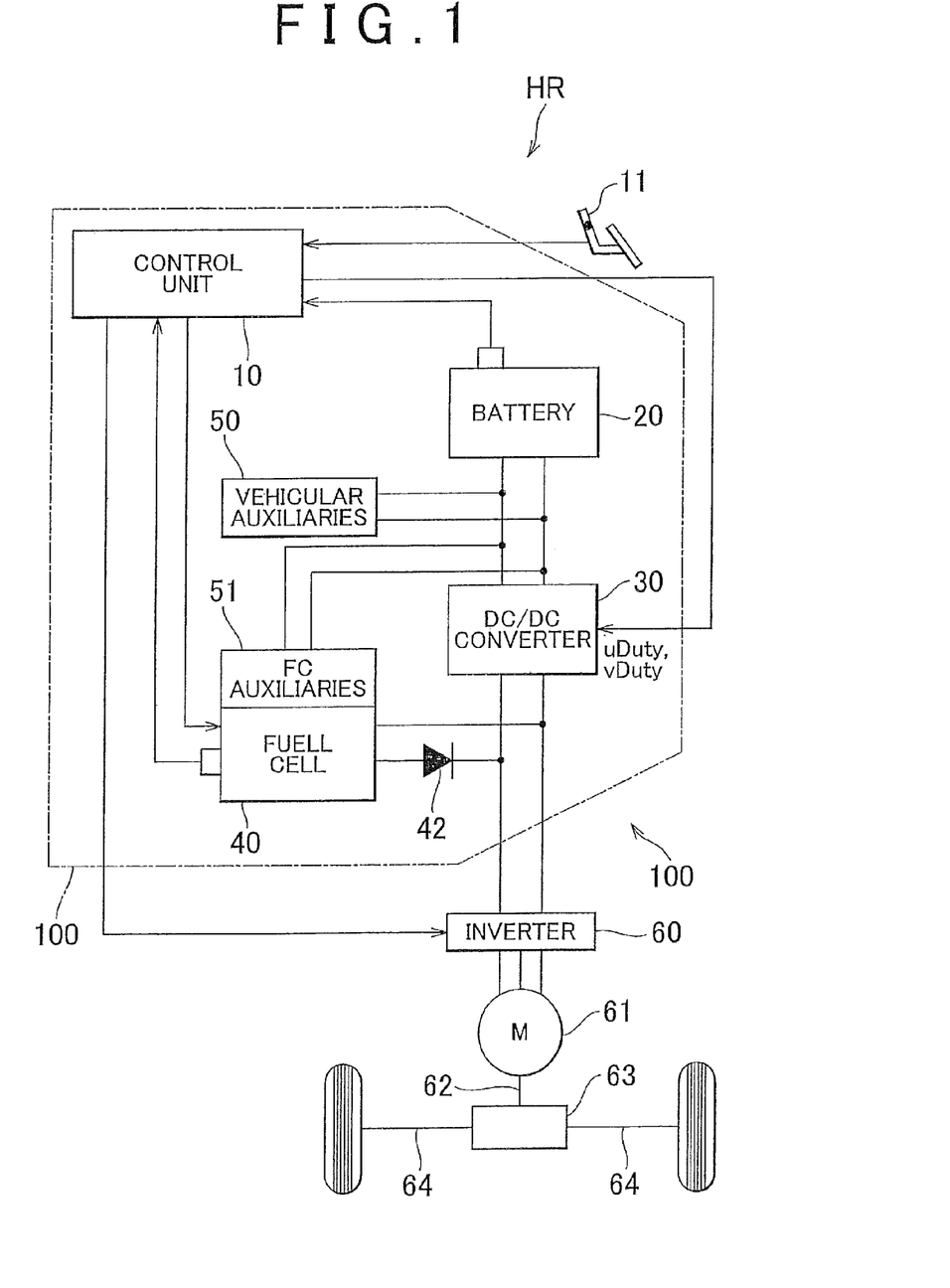
FIG. 1 is an explanatory view showing an overall configuration of a vehicle HR mounted with a fuel cell system according to one embodiment of the invention.

FIG. 1 is an explanatory view showing an overall configuration of the vehicle HR mounted with a fuel cell system 100 according to one embodiment of the invention. It should be noted that the following description will be given citing a fuel cell hybrid vehicle (an FCHV) as an example of the vehicle. The vehicle HR is mainly equipped with the fuel cell system 100, an inverter 60, a motor 61, an output shaft 62, a reduction gear 63, and a vehicle drive shaft 64.

The inverter 60 converts a DC current output from the fuel cell system 100 into a three-phase AC current and supplies the motor 61 with the three-phase AC current. The motor 61 is a motive power source of the vehicle HR which is designed as a synchronous motor, and is equipped with a phase coil for forming a revolving magnetic field. The motor 61 is connected to the output shaft 62 to transmit a motive power to the output shaft 62. It should be noted that the motor 61 can also function as a generator at the time of braking. The motive power output from the motor 61 to the output shaft 62 is transmitted to the vehicle drive shaft 64 via the reduction gear 63.

The fuel cell system 100 is mainly equipped with a control unit 10, a battery 20, a DC/DC converter 30, a fuel cell 40, vehicle auxiliaries 50, and FC auxiliaries 51. The control unit 10 is configured as a logical circuit mainly composed of a microcomputer. More specifically, the control unit 10 is equipped with a CPU (not shown) that carries out predetermined calculations and the like according to a preset control program, a ROM (not shown) in which a control program necessary for performing various calculation processings by means of the CPU, control data and the like are stored in advance, a RAM (not shown) from and into which various data necessary for performing the various calculation processings by means of the CPU as described above are temporarily read and written, an input/output port (not shown) into and from which various signals are input and output, and the like. The control unit 10 is connected to an accelerator pedal sensor 11, a shift position sensor (not shown), a brake sensor (not shown), and the like via signal lines. The control unit 10 acquires pieces of information on the driving of the vehicle, such as an accelerator opening degree, a vehicle speed and the like, from detection signals of these sensors, and generates a drive signal for the DC/DC converter 30 of the fuel cell system 100 (as will be described later in detail).

The battery 20 is a chargeable/dischargeable secondary battery. For example, various secondary batteries such as a lead storage battery, a nickel-cadmium storage battery, a nickel-hydrogen storage battery, a lithium secondary battery and the like can be employed as the battery 20. The battery 20 is interposed on a discharge route of the fuel cell 40 and connected to the fuel cell 40 in parallel therewith. It should be noted that a chargeable/dischargeable accumulator (e.g., a capacitor) other than a secondary battery may be employed instead of the battery 20.

The fuel cell 40 generates an electric power from a supplied fuel gas and a supplied oxidation gas. The fuel cell 40 has a stack structure in which a plurality of unit cells equipped with a membrane electrode assembly (hereinafter referred to as "the MEA") and the like are laminated on one another in series. Various types of fuel cells (e.g., a proton-exchange membrane fuel cell, a fused carbonate fuel cell, and the like) can be utilized as the fuel cell 40.

The battery 20 and the fuel cell 40 are connected to the inverter 60 in parallel therewith. Further, a circuit extending from the fuel cell 40 to the inverter 60 is provided with a diode 42 to restrain a current from the battery 20 or a current of an electric power generated by the motor 61 from flowing backward.

As described above, in order to realize appropriate output distribution in both power supplies, namely, the battery 20 and the fuel cell 40 that are connected in parallel with each other, a multiphase voltage conversion device (a DC/DC converter 30) is provided in this embodiment of the invention. The DC/DC converter 30 has a function of boosting (or lowering) a DC voltage input from the fuel cell 40 to a given target voltage and outputting the target voltage. The DC/DC converter 30 has therein a plurality of electric power supply modules operable in parallel with one another. The respective electric power supply modules constitute phases of the DC/DC converter 30. In this embodiment of the invention, a two-phase DC/DC converter that has therein an electric power module constituting a u-phase and an electric power supply module constituting a v-phase will be described as an example. It should be noted that the DC/DC converter 30 also functions as a switch for controlling a state of connection between the battery 20 and a line to which the battery 20 is connected. More specifically, when there is no need to charge or discharge the battery 20, the battery 20 is disconnected from the line to which the battery 20 is connected.

The vehicle auxiliaries 50 mean various electric power components used during the driving of the vehicle, or the like. The vehicle auxiliaries 50 include, for example, a lighting component, an air-conditioning component, and a hydraulic pump. The FC auxiliaries 51 mean various electric power components used to drive the vehicle. The FC auxiliaries 51 include, for example, a pump for supplying a fuel gas and a reformed material, and a heater for adjusting the temperature of a reformer. The vehicle auxiliaries 50 and the FC auxiliaries 51 are connected between the battery 20 and the DC/DC converter 30.

Figure 2:
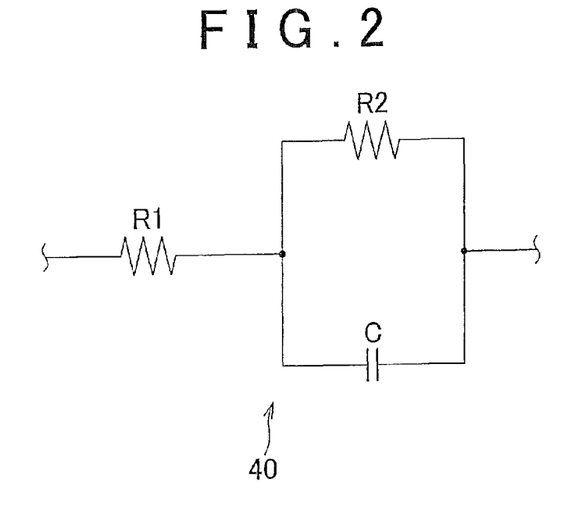
FIG. 2 is an explanatory view showing an equivalent circuit of a fuel cell.

FIG. 2 is an explanatory view showing an equivalent circuit of the fuel cell 40. The fuel cell 40 is expressed by a separator resistance R1, an MEA resistance R2, and an electrode capacitance C. These resistances R1 and R2 and the capacitance C form an internal impedance of the fuel cell 40. An internal characteristic of the fuel cell 40 can be grasped by measuring the impedance as will be described below.

Figure 3:
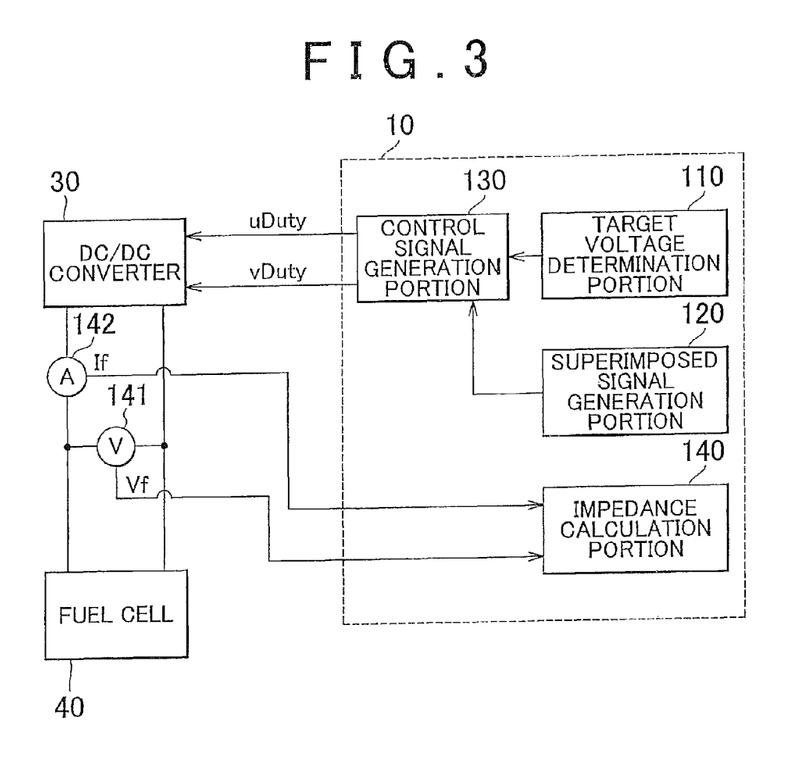
FIG. 3 is an explanatory view for explaining the measurement of an internal impedance of the fuel cell.

FIG. 3 is an explanatory view for explaining the measurement of the internal impedance of the fuel cell 40. The control unit 10 is equipped with a target voltage determination portion 110, a superimposed signal generation portion 120, a control signal generation portion 130, and an impedance calculation portion 140. The target voltage determination portion 110 determines an output target voltage from the DC/DC converter 30 on the basis of sensor signals input from the accelerator pedal sensor 11 (FIG. 1) and the like, and outputs this value to the control signal generation portion 130. The superimposed signal generation portion 120 generates a control waveform (e.g., sinusoidal waves with an amplitude a) for impedance measurement that is to be superimposed on the output target voltage, and outputs this control waveform to the control signal generation portion 130. It should be noted that the output target voltage and respective parameters of the control waveform (the type, frequency, and amplitude value of the waveform) can be appropriately changed in accordance with the design of the system or the like.

The control signal generation portion 130 generates control signals for controlling the respective phases of the DC/DC converter 30 by superimposing the output target voltage and the control waveform on each other. The control signal generation portion 130 sequentially outputs the control signals thus generated with a predetermined phase difference (more specifically, with a phase of an output pulse from the DC/DC converter 30 shifted by a timing corresponding to a desired delay) as control signals (uDuty, vDuty) corresponding to the respective phases of the DC/DC converter 30. The DC/DC converter 30 controls a DC voltage input from the fuel cell 40 on the basis of the control signals (uDuty, vDuty) corresponding to the respective phases, which are given from the control signal generation portion 130. More specifically, the DC/DC converter 30 turns ON/OFF a switching element of the electric power module corresponding to the u-phase inside the DC/DC converter 30 on the basis of the control signal uDuty. By the same token, the DC/DC converter 30 turns ON/OFF a switching element of the electric power module corresponding to the v-phase inside the DC/DC converter 30 on the basis of the control signal vDuty.

Figure 4A:
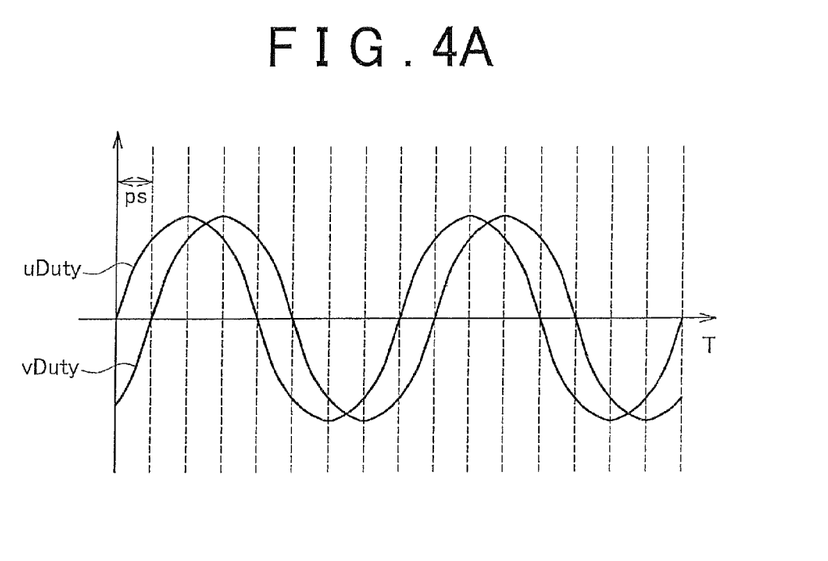
FIGS. 4A and 4B are explanatory views for explaining control signals generated by a control signal generation portion.
Figure 4B:
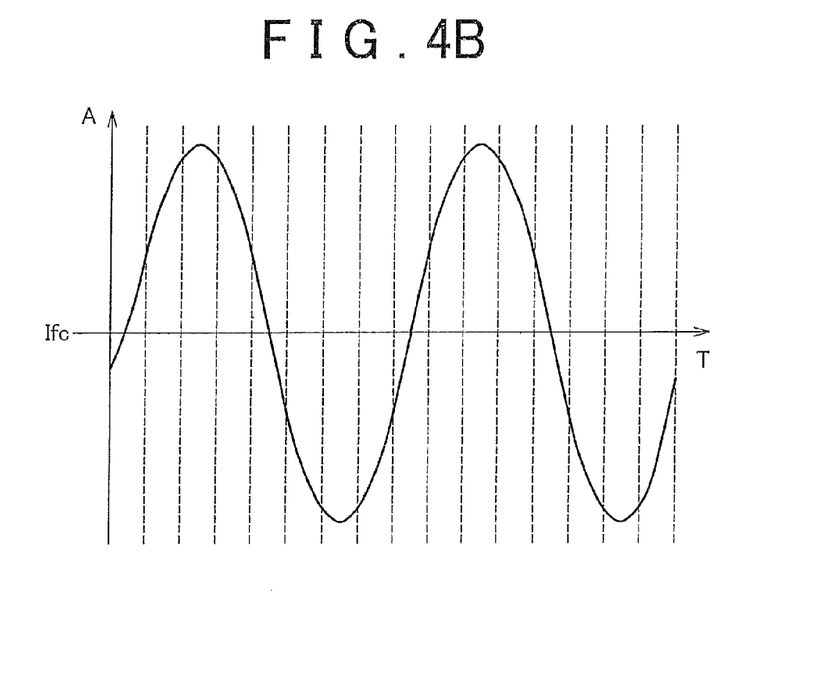

FIG. 4 is composed of explanatory views for explaining the control signals generated by the control signal generation portion 130. FIG. 4A schematically shows the control signals (uDuty, vDuty) output from the control signal generation portion 130 to the DC/DC converter 30. Thus, one of the control signals (uDuty, vDuty) corresponding to the respective phases in the DC/DC converter 30 is output with a delay corresponding to a predetermined phase difference ps with respect to the other. It should be noted that this phase difference ps can be stored in advance in a storage area inside the control unit 10. The phase difference ps in this embodiment of the invention is 45°. FIG. 4B is an explanatory view schematically showing a frequency component Ifc of an FC current output from the DC/DC converter 30. It should be noted that the FC current means an output current at an actual operation point of the fuel cell 40.

FIG. 5 is composed of explanatory views for explaining the sampling in the impedance calculation portion 140. FIG. 5A is an explanatory view schematically showing the frequency component Ifc of the FC current output from the DC/DC converter 30. The impedance calculation portion 140 samples the frequency component Ifc of the FC current output from the DC/DC converter 30 on cycles (i.e., SFu, SFv) corresponding to sampling frequencies corresponding to the respective phases having the same phase difference ps as the phase difference ps between the control signals uDuty, vDuty shown in FIG. 4A. That is, in the example of FIG. 5A, the impedance calculation portion 140 samples the two sampling frequencies corresponding to the number of the phases respectively at the timings SFu, SFv of a central region of sinusoidal waves and a region having a maximum deviation from the center of the sinusoidal waves. It should be noted that FIG. 5A is nothing but an example, and that the sampling frequencies can be arbitrarily determined.

Figure 5A:
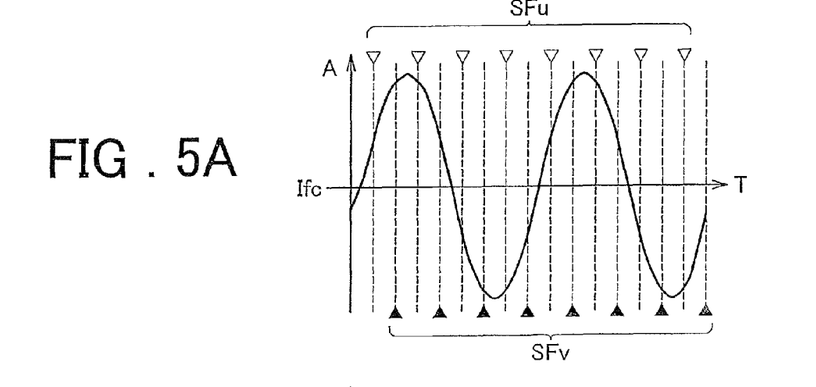
FIGS. 5A to 5D are explanatory views for explaining the sampling in an impedance calculation portion.
Figure 5B:
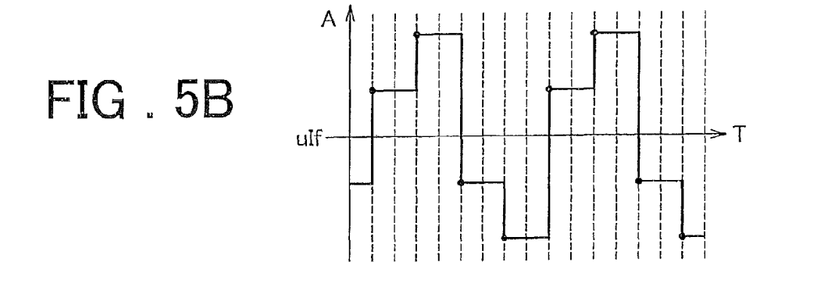
Figure 5C:
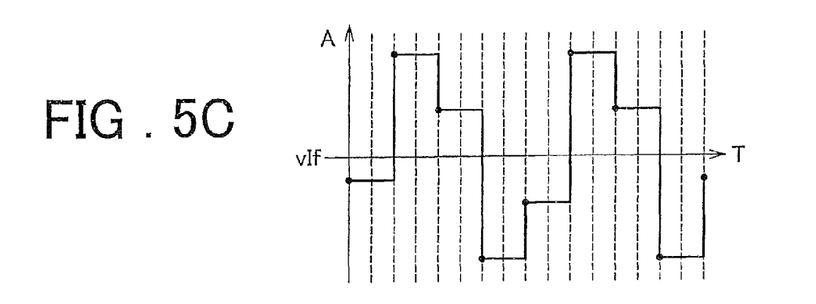
Figure 5D:
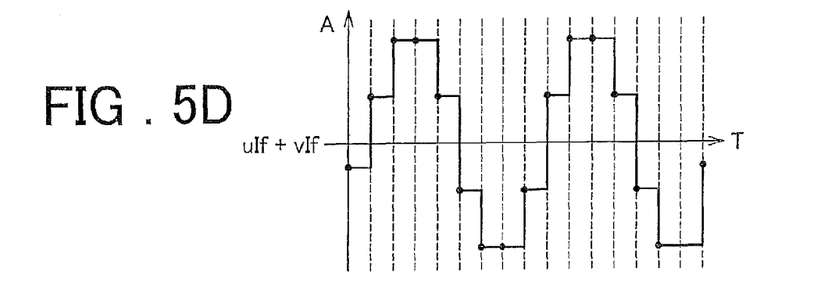

FIG. 5B shows a result uIf of the sampling performed by the impedance calculation portion 140 on the sampling cycle SFu. FIG. 5C shows a result vIf of the sampling performed by the impedance calculation portion 140 on the sampling cycle SFv. Further, FIG. 5D shows a sampling result uIf+vIf as a sum of the results uIf and vIf obtained as described above.

The impedance calculation portion 140 also samples the frequency component Vfc of the output voltage (hereinafter referred to also as "an FC voltage") at the actual operation point of the fuel cell 40 detected by the voltage sensor 141, in the same manner as explained in FIG. 5, and acquires a sampling result of the frequency component Vfc of the FC voltage. The impedance calculation portion 140 thus performs sampling processings of the FC current and the FC voltage, and then calculates an impedance of the fuel cell 40 by, for example, dividing an FC voltage signal subjected to an Fourier transform processing by an FC current signal subjected to the Fourier transform processing.

As described above, according to the first embodiment of the invention, when measuring the FC voltage and the FC current for impedance calculation, the impedance calculation portion 140 performs sampling on the cycles SFu, SFv corresponding to the sampling frequencies corresponding to the respective phases, which have the same phase difference ps as the phase difference ps between the control signals uDuty, vDuty output to control the respective phases of the DC/DC converter 30. Thus, the impedance calculation portion 140 can obtain a detailed sampling result close in shape to the control waveform as shown in FIG. 5D, as a result of the measurement of the FC current and the FC voltage. The impedance calculation portion 140 carries out impedance calculation of the fuel cell 40 on the basis of the measured values of the FC current and FC voltage thus obtained. As a result, the impedance measurement performance of the fuel cell in the fuel cell system equipped with the multiphase voltage conversion device (the DC/DC converter 30) can be improved.

Furthermore, according to the first embodiment of the invention, the impedance calculation portion 140 samples the FC current and the FC voltage on the cycles SFu, SFv corresponding to the plurality of the sampling frequencies. Therefore, the load applied to the CPU in the control unit 10 can be reduced in comparison with a case where the impedance calculation portion 140 performs sampling on a cycle corresponding to a single sampling frequency that is higher than the sampling frequency.

B. Second Embodiment

Figure 6:
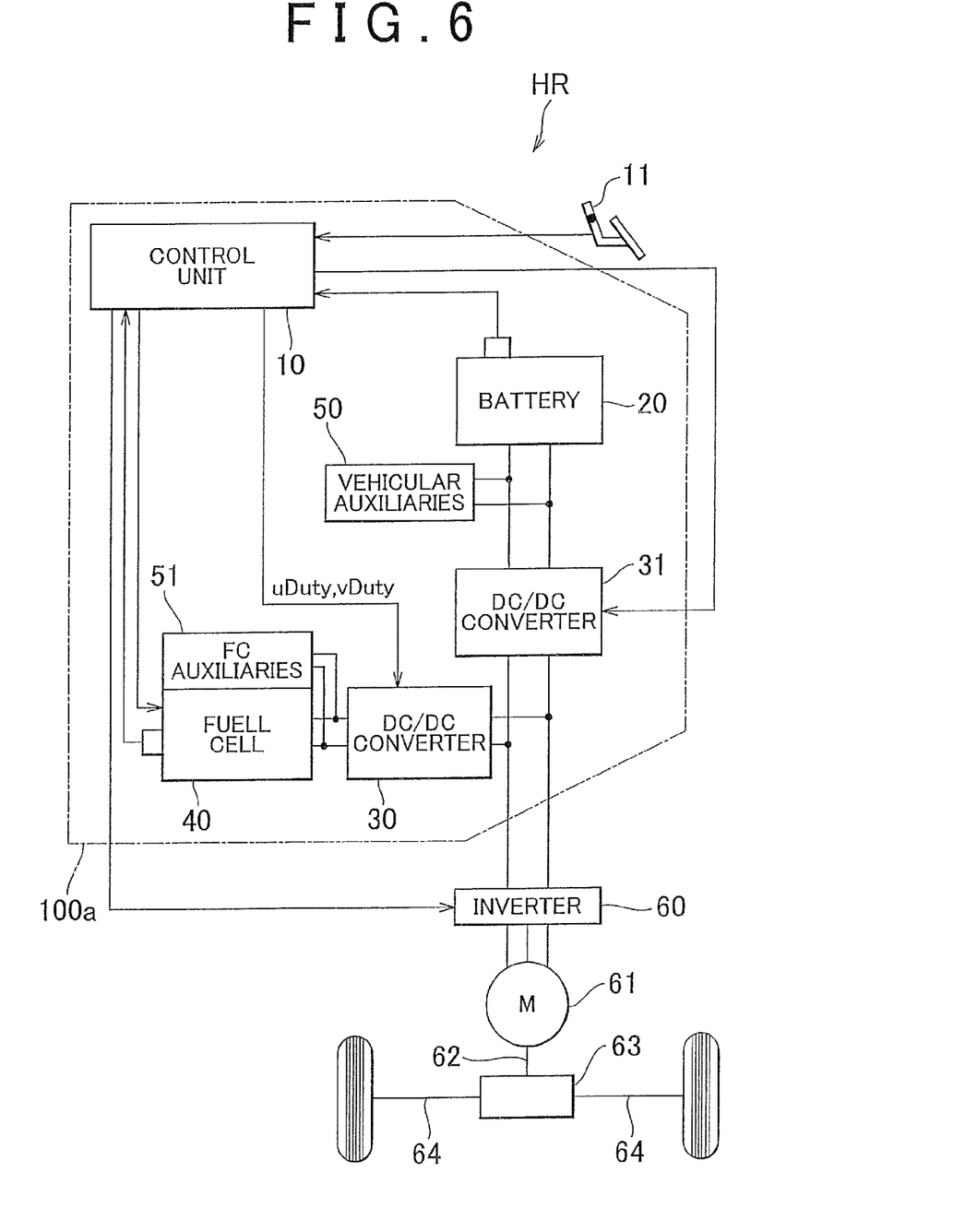
FIG. 6 is an explanatory view showing an overall configuration of the vehicle HR mounted with a fuel cell system according to the second embodiment of the invention.

FIG. 6 is an explanatory view showing an overall configuration of the vehicle HR mounted with a fuel cell system 100*a* according to the second embodiment of the invention. The difference between the second embodiment of the invention and the first embodiment of the invention shown in FIG. 1 consists in that a DC/DC converter 31 is further provided, and the second embodiment of the invention is identical to the first embodiment of the invention in other configurational details and other operational details. It should be noted in FIG. 6 that configurational components identical to those of the first embodiment of the invention are denoted by the same reference symbols as in the foregoing first embodiment of the invention, and that the detailed description of such components is omitted. The DC/DC converter 31 is interposed between the battery 20 and the inverter 60, and has the function of boosting (or lowering) a DC voltage input from the battery 20 to a given target voltage and outputting the target voltage. It should be noted that the DC/DC converter 30 of the second embodiment of the invention is different from that of the first embodiment of the invention in that it does not function as a switch for controlling the state of connection between the battery 20 and the line to which the battery 20 is connected.

In this configuration as well, as in the case of the first embodiment of the invention, the impedance measurement performance of the fuel cell in the fuel cell system equipped with the multiphase voltage conversion device (the DC/DC converter 30) can be improved.

C. Modified Examples

It should be noted that the invention is not limited to the foregoing embodiments thereof, and that the invention can be implemented in various modes without departing from the gist thereof. For example, the invention can also be modified as follows.

C1. Modified Example 1

The foregoing embodiments of the invention have been described citing the two-phase (N=2) DC/DC converter 30 as an example of the multiphase voltage conversion device. However, it is sufficient that the DC/DC converter of the invention be of a multiphase type, and the number of phases of the DC/DC converter adopted in the invention is arbitrary. For example, a three-phase DC/DC converter can be adopted. In this case, the impedance calculation portion 140 performs sampling on cycles SFu, SFv, SFw corresponding to three sampling frequencies delayed by the same phase difference as the phase difference among control signals (uDuty, vDuty, wDuty) corresponding to the respective phases. Therefore, more detailed sampling results of the FC current and the FC voltage can be obtained. As a result, the performance of measuring the impedance of the fuel cell can further be improved.

C2. Modified Example 2

In the foregoing embodiments of the invention, the various set values in the fuel cell system 100 are exemplified. However, the various set values (e.g., the phase difference ps) in the fuel cell system 100 can be arbitrarily determined. For example, the phase difference ps may be 360°/N.

C3. Modified Example 3

The foregoing embodiments of the invention have been described citing the fuel-cell-powered vehicle as an example of the vehicle. However, various vehicles can be assumed as the vehicle mounted with the fuel cell system according to the invention. For example, the invention is also applicable to electric vehicles and hybrid vehicles. Furthermore, the fuel cell system according to the invention can also be applied to mobile objects other than vehicles (e.g., ships, airplanes, and the like).

While the invention has been described with reference to the example embodiments thereof, it is to be understood that the invention is not limited to the described embodiments or constructions. To the contrary, the invention is intended to cover various modifications and equivalent arrangements. In addition, while the various elements of the disclosed invention are shown in various example combinations and configurations, other combinations and configurations, including more, less or only a single element, are also within the scope of the appended claims.

The invention claimed is:

1. A fuel cell system comprising:
a fuel cell;
a multiphase voltage conversion device with N-phases (N being an integer equal to or larger than two) that is connected to the fuel cell;
a control signal generation portion that generates control signals to control each phase of the multiphase voltage conversion device by superimposing a control waveform for measuring impedance on a voltage indicating an output target voltage of the multiphase voltage conversion device, and sequentially outputs the control signals corresponding to N phases with a predetermined phase difference to the multiphase voltage conversion device; and
an impedance calculation portion that measures a current of the fuel cell and a voltage of the fuel cell on cycles corresponding to N predetermined sampling frequencies having a phase difference equal to the predetermined phase difference, and calculates an impedance of the fuel cell based on the measured current and the measured voltage.

2. The fuel cell system according to claim 1, wherein the predetermined phase difference is 360°/N.

3. The fuel cell system according to claim 1, further comprising an accumulator, and a voltage conversion device that is connected to the accumulator.

4. A method of measuring an impedance of a fuel cell system that includes a fuel cell and a multiphase voltage conversion device with N-phases (N being an integer equal to or larger than two) that is connected to the fuel cell, the method comprising:
generating control signals to control each phase of the multiphase voltage conversion device by superimposing a control waveform for measuring impedance on a voltage indicating an output target voltage of the multiphase voltage conversion device;
sequentially outputting signals corresponding to N phases with a predetermined phase difference to the multiphase voltage conversion device; and
measuring a current of the fuel cell and a voltage of the fuel cell on cycles corresponding to N predetermined sampling frequencies having a phase difference equal to the predetermined phase difference, and calculating an impedance of the fuel cell based on the measured current and the measured voltage.

5. The fuel cell system according to claim 1, wherein the predetermined phase difference is stored in advance in a storage area inside a control unit of the fuel cell system.

\* \* \* \* \*

UNITED STATES PATENT AND TRADEMARK OFFICE
CERTIFICATE OF CORRECTION

PATENT NO. : 8,952,702 B2
APPLICATION NO. : 13/638785
DATED : February 10, 2015
INVENTOR(S) : Takahiko Hasegawa et al.

It is certified that error appears in the above-identified patent and that said Letters Patent is hereby corrected as shown below:

Specification

In column 4, line 25, change "power module" to -- power supply module --.

In column 4, line 38, change "to drive the vehicle" to -- to drive the fuel cell --.

Signed and Sealed this
Twenty-ninth Day of September, 2015

Michelle K. Lee
*Director of the United States Patent and Trademark Office*